US012686923B2

(12) United States Patent
Yau et al.

(10) Patent No.: US 12,686,923 B2
(45) Date of Patent: Jul. 21, 2026

(54) ARC REDUCTION AND RF CONTROL FOR ELECTROSTATIC CHUCKS IN SEMICONDUCTOR PROCESSING

(71) Applicant: Applied Materials, Inc., Santa Clara, CA (US)

(72) Inventors: Allison Yau, Mountain View, CA (US); Manoj Kumar Jana, San Jose, CA (US); Wen-Shan Lin, San Jose, CA (US); Zhiling Dun, Campbell, CA (US); Xinhai Han, Palo Alto, CA (US); Deenesh Padhi, Saratoga, CA (US); Jian Li, Fremont, CA (US); Yuanchang Chen, Santa Clara, CA (US); Wenhao Zhang, San Jose, CA (US); Edward P. Hammond, Hillsborough, CA (US); Alexander V. Garachtchenko, Brentwood, CA (US); Ganesh Balasubramanian, Fremont, CA (US); Juan Carlos Rocha-Alvarez, San Carlos, CA (US); Sathya Ganta, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 79 days.

(21) Appl. No.: 18/482,560

(22) Filed: Oct. 6, 2023

(65) Prior Publication Data

US 2025/0116001 A1     Apr. 10, 2025

(51) Int. Cl.
*C23C 16/458*          (2006.01)
*C23C 16/34*           (2006.01)
(Continued)

(52) U.S. Cl.
CPC .......... *C23C 16/4586* (2013.01); *C23C 16/34* (2013.01); *C23C 16/401* (2013.01);
(Continued)

(58) Field of Classification Search
CPC .............. C23C 16/505; C23C 16/4586; C23C 16/4583; H01J 37/32174; H01J 37/32715; H01J 37/32697
See application file for complete search history.

(56)                    References Cited

U.S. PATENT DOCUMENTS

2009/0314433 A1*  12/2009  Hoffman ............. H01L 21/6833
                                                            156/345.48
2013/0107415 A1*   5/2013  Banna ................. H01L 21/6831
                                                            361/234
(Continued)

FOREIGN PATENT DOCUMENTS

JP      2004535658 A     11/2004
TW      201935596 A      9/2019
WO      2023146864 A1    8/2023

OTHER PUBLICATIONS

International Search Report with accompanying Written Opinion, mailed on Jan. 14, 2025, in corresponding International Patent Application No. PCT/US2024/049828, 10 pages.
(Continued)

*Primary Examiner* — Joseph A Miller, Jr.
(74) *Attorney, Agent, or Firm* — Kilpatrick Townsend & Stockton LLP

(57)               ABSTRACT

A semiconductor processing chamber may include a pedestal configured to support a substrate during a plasma-enhanced chemical-vapor deposition (PECVD) process that forms a film on a surface of the substrate. The chamber may also include one or more internal meshes embedded in the pedestal. The one or more internal meshes may be configured to deliver radio-frequency (RF) power to a plasma in
(Continued)

the semiconductor processing chamber during the PECVD process. An outer diameter of the one or more internal meshes may be less that a diameter of the substrate. The chamber may further include an RF source configured to deliver the RF power to the one more internal meshes. This configuration may reduce arcing within the processing chamber.

17 Claims, 6 Drawing Sheets

(51) Int. Cl.
    *C23C 16/40*        (2006.01)
    *H01J 37/32*      (2006.01)
(52) U.S. Cl.
    CPC .. *H01J 37/32174* (2013.01); *H01J 37/32697* (2013.01); *H01J 37/32715* (2013.01); *H01J 2237/3321* (2013.01)

(56) References Cited

U.S. PATENT DOCUMENTS

| | | | |
|---|---|---|---|
| 2016/0013022 A1 | 1/2016 | Ayoub et al. | |
| 2017/0069464 A1* | 3/2017 | Ye | H01J 37/32082 |
| 2021/0166915 A1* | 6/2021 | Hammond, IV .. | H01J 37/32715 |
| 2023/0187189 A1 | 6/2023 | Jung et al. | |

OTHER PUBLICATIONS

Korean Patent Application No. 10-2025-7033639, "Office Action", Apr. 28, 2026, 16 pages.
International Patent Application No. PCT/US2024/049828, "International Preliminary Report on Patentability", Apr. 16, 2026, 7 pages.

* cited by examiner

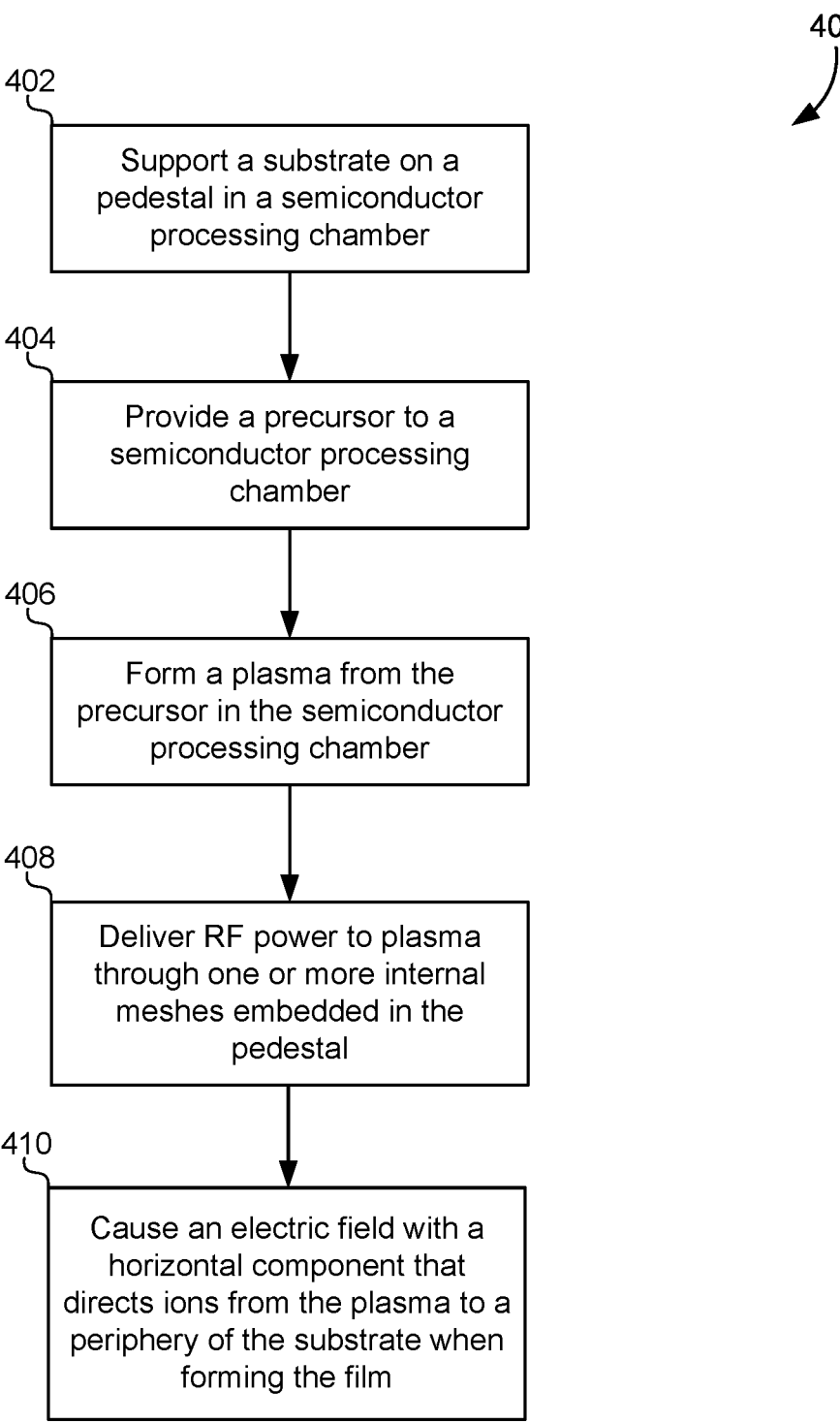

400

402

Support a substrate on a pedestal in a semiconductor processing chamber

404

Provide a precursor to a semiconductor processing chamber

406

Form a plasma from the precursor in the semiconductor processing chamber

408

Deliver RF power to plasma through one or more internal meshes embedded in the pedestal

410

Cause an electric field with a horizontal component that directs ions from the plasma to a periphery of the substrate when forming the film

FIG. 4

ARC REDUCTION AND RF CONTROL FOR ELECTROSTATIC CHUCKS IN SEMICONDUCTOR PROCESSING

TECHNICAL FIELD

This disclosure generally describes methods and systems for reducing arcing in semiconductor processing chambers induced by electrostatic chucking devices. More specifically, this disclosure describes mesh size and power characteristics that reduce arcing and improve film quality at a periphery of a substrate.

BACKGROUND

Integrated circuits are made possible by processes which produce intricately patterned material layers on substrate surfaces. Producing patterned material on a substrate requires controlled methods of formation and removal of exposed material. As device sizes continue to shrink, material formation may affect subsequent operations. For example, in gap filling operations a material may be formed or deposited to fill a trench or other features formed on a semiconductor substrate. As features may be characterized by higher aspect ratios and reduced critical dimensions, these filling operations may be challenged. For example, as the deposition may occur at the top and along sidewalls of the feature, continued deposition may pinch off the feature and may produce voids within the feature. This can impact device performance and subsequent processing operations. In some devices, it may be necessary to selectively remove sidewall material deposited in the features.

Thus, there is a need for improved systems and methods that can be used to produce high quality devices and structures. These and other needs are addressed by the present technology.

SUMMARY

In some embodiments, a semiconductor processing chamber may include a pedestal configured to support a substrate during a plasma-enhanced chemical-vapor deposition (PECVD) process that forms a film on a surface of the substrate. The chamber may also include one or more internal meshes embedded in the pedestal. The one or more internal meshes may be configured to deliver radio-frequency (RF) power to a plasma in the semiconductor processing chamber during the PECVD process. The chamber may additionally include an RF source configured to deliver the RF power to the one or more internal meshes. The chamber may further include one or more variable capacitors coupled between the RF source and the one or more internal meshes. Adjusting a capacitance of the one or more variable capacitors may adjust an amount of the RF power that is provided to the one or more internal meshes.

In some embodiments, a method of reducing cracks in films formed on peripheries of substrates during deposition processes may include supporting a substrate on a pedestal in a semiconductor processing chamber. The semiconductor processing chamber may be configured to perform a plasma-enhanced chemical-vapor deposition (PECVD) process that forms a film on a surface of the substrate. The method may also include providing a precursor to a semiconductor processing chamber. The precursor may include a material for the film to be formed on the substrate. The method may additionally include forming a plasma from the precursor in the semiconductor processing chamber. The method may further include delivering radio-frequency (RF) power to plasma through one or more internal meshes embedded in the pedestal. The RF power may cause an electric field comprising a horizontal component that directs ions from the plasma to a periphery of the substrate when forming the film.

In some embodiments, a semiconductor processing chamber may include a pedestal configured to support a substrate during a plasma-enhanced chemical-vapor deposition (PECVD) process that forms a film on a surface of the substrate. The chamber may also include one or more internal meshes embedded in the pedestal. The one or more internal meshes may be configured to deliver radio-frequency (RF) power to a plasma in the semiconductor processing chamber during the PECVD process. An outer diameter of the one or more internal meshes may be less that a diameter of the substrate. The chamber may further include an RF source configured to deliver the RF power to the one or more internal meshes.

In any embodiments, any and all of the following features may be implemented in any combination and without limitation. The one or more internal meshes may include a plurality of internal meshes. The one or more internal meshes may include a single internal mesh. The one or more internal meshes may include two hemispherical meshes. The chamber may include an external mesh having a ring-shape that encircles the one or more internal meshes, and a variable capacitor coupled between the RF source and the external mesh. Adjusting the capacitance of the variable capacitor may adjust an amount of the RF power that is provided to the external mesh. The system may include a computer system that is programmed to adjust the variable capacitor and the one or more variable capacitors during the PECVD process to adjust the amount of RF power delivered to the one or more internal meshes and the amount of RF power delivered to the external mesh. The capacitance of the variable capacitor may be decreased until less than 5% of the film on a periphery of the substrate is cracked. A diameter of the one or more internal meshes may be less than a diameter of the substrate such that the substrate may entirely cover the one or more internal meshes when supported by the pedestal. An outer diameter of the one or more internal meshes may be less that a diameter of the substrate. The method/operations may also include forming the film on the substrate by delivering the RF power to the plasma, where the film may include one or more alternating layers of oxide and nitride. The film may also include a relatively thick layer of silicon oxide formed using a precursor of tetraethyl orthosilicate (TEOS) comprising a thickness of more than 25 μm. The method/operations may also include adjusting a capacitance of one or more variable capacitors to adjust an amount of the RF power that is provided to the one or more internal meshes and cause the horizontal component of the electric field. The diameter of the substrate may be between 0 mm and 5 mm greater than the outer diameter of the one or more meshes. The outer diameter of the one or more meshes may be between 95% and 99% of the diameter of the substrate. The chamber may also include an external mesh that is ring-shaped and surrounds the one or more internal meshes, and an inner diameter of the external mesh is greater than the diameter of the substrate. A difference between the outer diameter of the one or more internal meshes and the diameter of the substrate may be sufficient to eliminate arcing from the one or more internal meshes during the PECVD process. The pedestal need not include an external mesh that surrounds the one or more internal meshes such that any meshes that deliver the RF power to the plasma are covered by the substrate on the pedestal.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

FIG. 4 illustrates a flowchart of a method of reducing cracks in films on peripheries of substrates during deposition processes, according to some embodiments.

DETAILED DESCRIPTION

Described herein are characteristics for sizing and powering radio-frequency (RF) meshes in a pedestal during deposition processes, such as a plasma-enhanced chemical vapor deposition. Generally, the electric field created by the potential difference between the plasma and the pedestal is directed vertically and perpendicular to the top surface of the substrate. While this creates a durable film on top of the substrate, the film tends to crack at the edges or bevel on the periphery of the substrate. For example, the bevel may include an angle or gap that makes it difficult for the ions in the plasma to contact the substrate when the electric field is purely vertical. In consequence, the bevel film is formed mainly by plasma radicals, and is thus more prone to cracking or peeling. Arcing may also occur from charge buildup on the RF mesh in the pedestal.

This disclosure describes techniques for reducing arcing and improving the film quality at the periphery of the substrate. The size of the internal meshes may be reduced such that the outer diameter of these meshes is less than the diameter of the substrate. This creates a potential difference between the RF meshes and the plasma that in turn creates a horizontal component of the electric field. This horizontal component directs the ions towards the bevel edge of the substrate and improves the film quality. Covering the internal meshes with the substrate also effectively reduces and may even prevent arcing from the electrostatic chuck to other portions of the processing chamber. Some embodiments may include variable capacitors for each of the meshes in the pedestal. By changing the capacitance of these variable capacitors, the relative RF power delivered to each mesh may be adjusted. For example by increasing power to the internal meshes and/or decreasing power to an external mesh outside of the substrate diameter, the electric field may be directed towards the edge of the substrate at the periphery.

After describing general aspects of a chamber according to some embodiments of the present technology in which plasma processing operations discussed below may be performed, specific methodology may be discussed. It is to be understood that the present technology is not intended to be limited to the specific films, chambers or processes discussed, as the techniques described may be used to improve a number of film formation processes, and may be applicable to a variety of processing chambers and operations.

Figure 1:
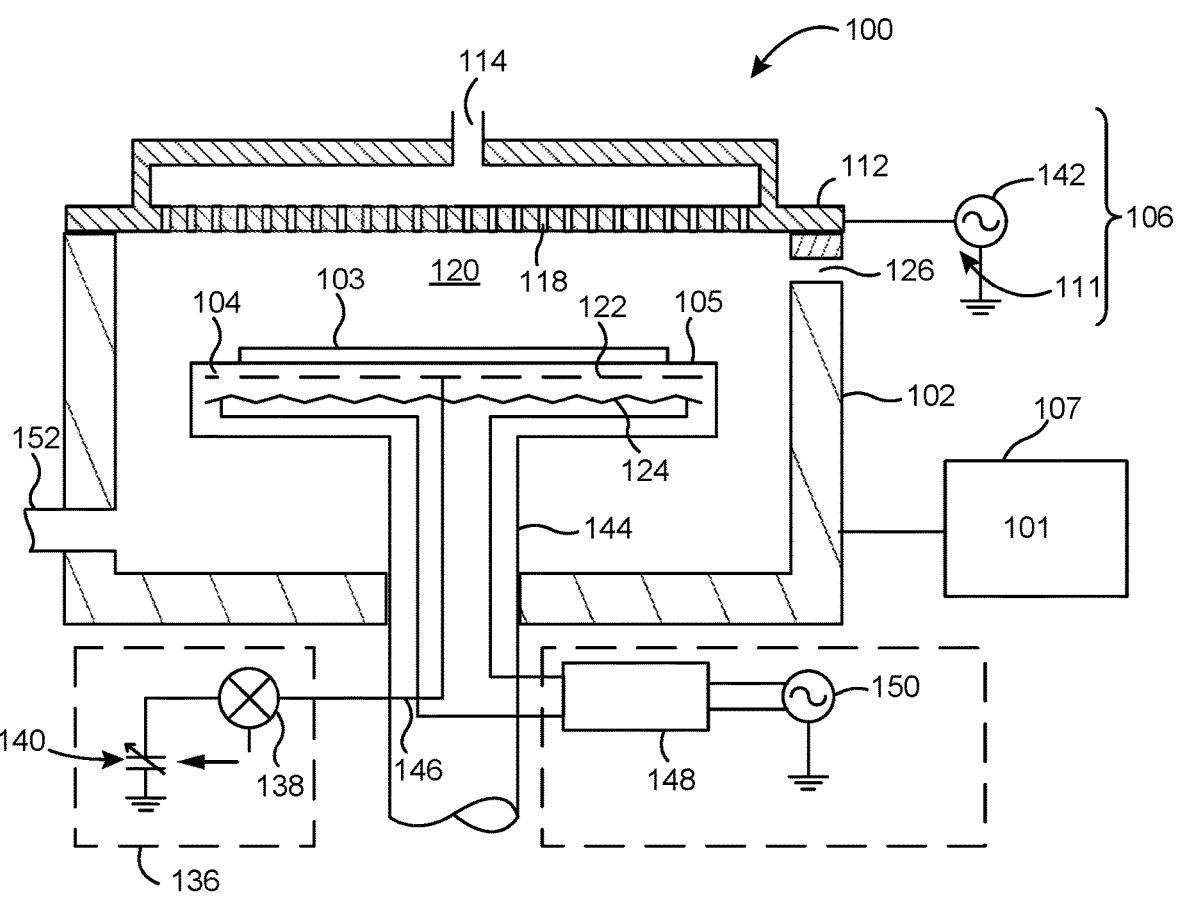
FIG. 1 shows a schematic cross-sectional view of an exemplary processing chamber according to some embodiments of the present technology.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers, etch material layers, form other material layers, or a combination thereof, although it is to be understood that deposition and etch methods may similarly be performed in any chamber within which deposition and etch processes may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. In some embodiments, the substrate support 104 may be rotatable, along a vertical axis, where a shaft 144 of the substrate support 104 may be located, or may be stationary. Alternatively, the substrate support 104 may be lifted up to rotate as necessary during a deposition process.

A gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

A first electrode 122 may be coupled with the substrate support 104. The first electrode 122 may be embedded within the substrate support 104 or coupled with a surface of the substrate support 104. The first electrode 122 may be a plate, a perforated plate, a mesh, a wire screen, or any other distributed arrangement of conductive elements. The first electrode 122 may be a tuning electrode and may be coupled with a tuning circuit 136 by a conduit 146, for example a cable having a selected resistance, such as 50 ohms, for example, disposed in the shaft 144 of the substrate support 104. The tuning circuit 136 may have an electronic sensor 138 and an electronic controller 140, which may be a variable capacitor. The electronic sensor 138 may be a voltage or current sensor and may be coupled with the electronic controller 140 to provide further control over plasma conditions in the processing volume 120.

A second electrode 124, which may be a bias electrode and/or an electrostatic chucking electrode, may be coupled with the substrate support 104. The second electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120, such as via a system controller 101 which may be contained within a processor 107. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the second electrode 124 in some embodiments.

Upon energizing a plasma in the processing volume 120, a potential difference may be established between the plasma and the first electrode 122. The electronic controller 140 may then be used to adjust the flow properties of the ground paths represented by the tuning circuit 136. A set point may be delivered to the tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Tuning circuit 136 may have a variable impedance that may be adjusted using the electronic controller 140. Where the electronic controller 140 is a variable capacitor, the capacitance range of each of the variable capacitors, may be chosen to provide an impedance range. This range may depend on the frequency and voltage characteristics of the plasma, which may have a minimum in the capacitance range of each variable capacitor. Hence, when the capacitance of the electronic controller 140 is at a minimum or maximum, impedance of the tuning circuit 136 may be high, resulting in a plasma shape that has a minimum aerial or lateral coverage over the substrate support. When the capacitance of the electronic controller 140 approaches a value that minimizes the impedance of the tuning circuit 136, the aerial coverage of the plasma may grow to a maximum, effectively covering the entire working area of the substrate support 104. As the capacitance of the electronic controller 140 deviates from the minimum impedance setting, the plasma shape may shrink from the chamber walls and aerial coverage of the substrate support may decline.

The electronic sensor 138 may be used to tune the tuning circuit 136 in a closed loop. A set point for current or voltage, depending on the type of sensor used, may be installed in each sensor, and the sensor may be provided with control software that determines an adjustment to the electronic controller 140 to minimize deviation from the set point. Consequently, a plasma shape may be selected and dynamically controlled during processing. It is to be understood that, while the foregoing discussion is based on electronic controller 140, which may be a variable capacitor, any electronic component with adjustable characteristic may be used to provide tuning circuit 136 with adjustable impedance.

Processing chamber 100 may be utilized in some embodiments of the present technology for processing methods that may include bottom-up deposition of materials for semiconductor structures. It is to be understood that the chamber described is not to be considered limiting, and any chamber that may be configured to perform operations as described may be similarly used.

Figure 2A:
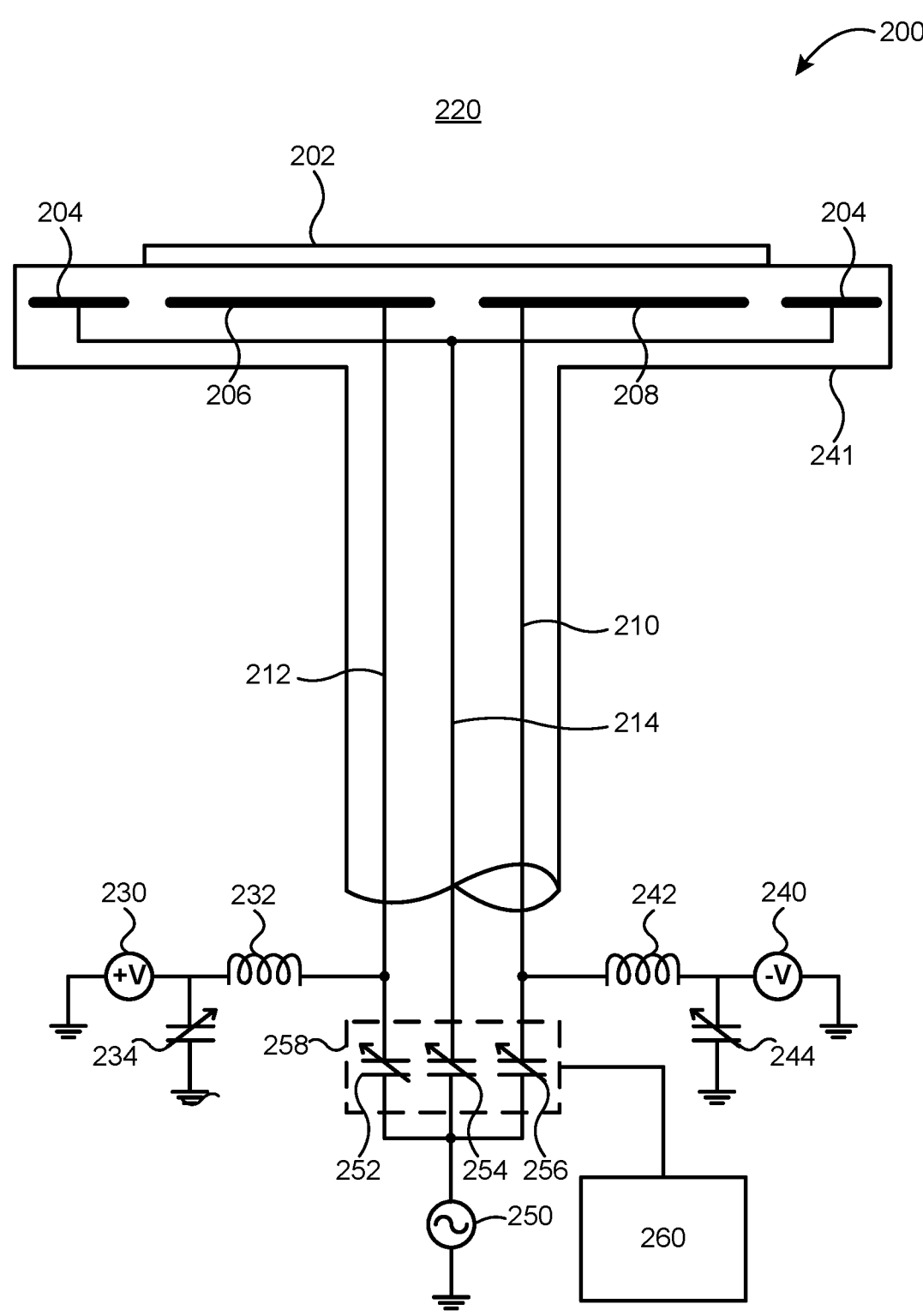
FIG. 2A illustrates an implementation of a semiconductor processing chamber, according to some embodiments.

FIG. 2A illustrates an implementation of a semiconductor processing chamber 200, according to some embodiments. For example, the semiconductor processing chamber 200 may be a specific implementation of the processing chamber 100 illustrated above in FIG. 1. In some embodiments, the semiconductor processing chamber 200 may be specifically configured to perform chemical vapor deposition (CVD) on a substrate. Chemical vapor deposition is a process used to deposit thin films of material onto a substrate using a chemical reaction of vapor-phase precursor molecules. A precursor gas may be introduced into the semiconductor processing chamber 200 and subjected to elevated temperatures and/or pressures to form a solid film on a surface of the substrate.

Chemical vapor deposition may be used to deposit a wide range of materials, including ceramics, organic compounds, semiconductors, metals, and so forth. By way of example, this disclosure may refer to the deposition of alternating oxide and/or nitride layers in an "ONO" stack that may be used for various semiconductor devices. This disclosure may also refer specifically to depositing a relatively thick film of silicon oxide using a precursor of tetraethyl orthosilicate (TEOS) over a semiconductor layer or over the ONO stack. However, these types of film depositions are provided only by way of example and are not meant to be limiting. The techniques described herein may be used to deposit any type film on a substrate.

Some embodiments of the CVD process may be enhanced using a plasma (PECVD). A PECVD process is a variation on the CVD process that forms a plasma in a processing region 220 of the semiconductor processing chamber 200 in order to enhance the film deposition and improve the properties of the deposited films. For example, the precursor gases may be introduced into the processing region 220 along with a carrier gas, such as nitrogen or argon. A plasma may then be formed with the precursor gas in a highly energized state of radicals, ions, and other species. The energetic ions of the plasma may disassociate from the precursor molecules such that they can more readily participate in the chemical reactions during the film deposition. Additionally, the plasma may generate highly reactive radicals (e.g., atomic hydrogen, atomic nitrogen, and so forth), which may also participate in surface reactions and affect the properties of the deposited films.

Figure 2B:
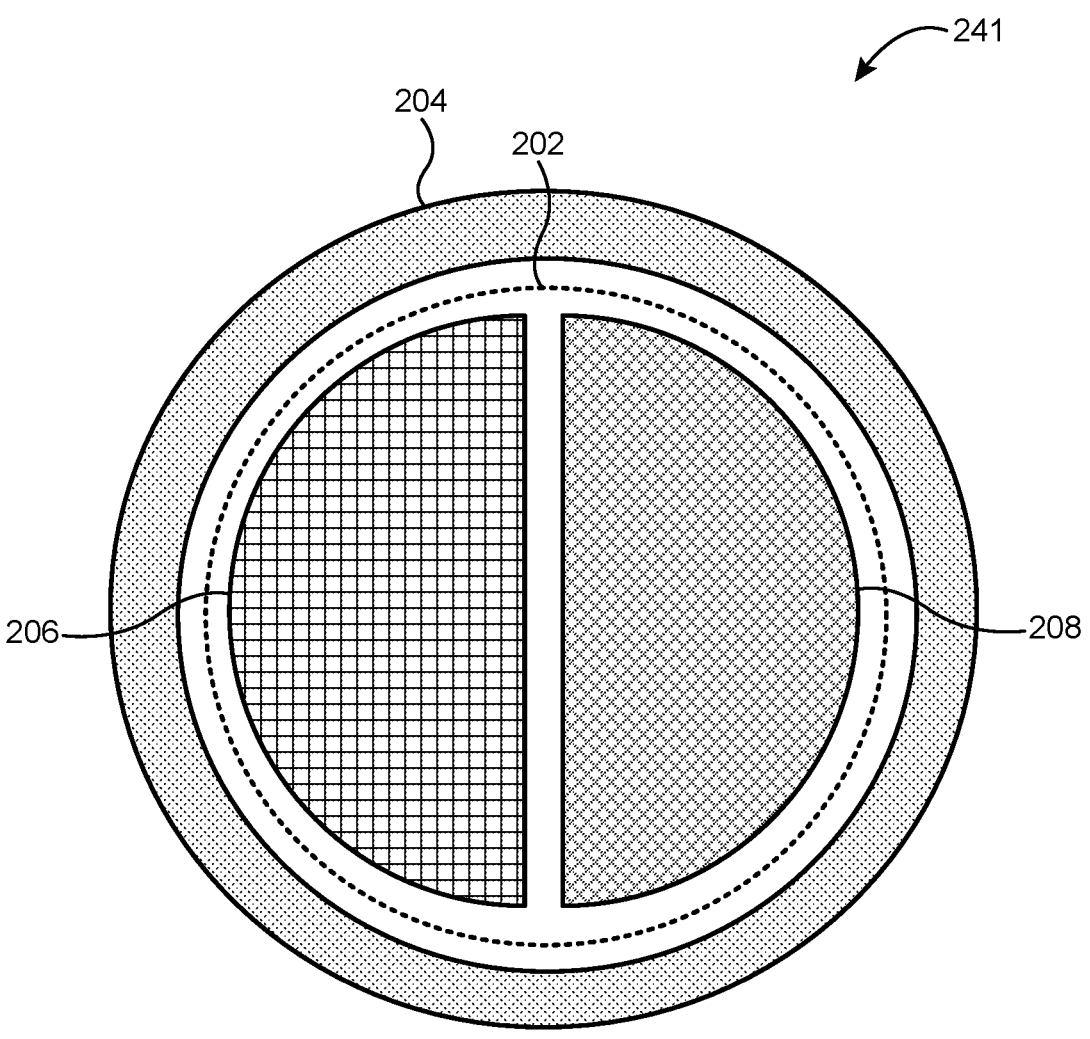
FIG. 2B illustrates an example configuration of the various meshes that may be included in the pedestal, according to some embodiments.

In order to energize the plasma in the processing region 220, the semiconductor processing chamber 200 may include a pedestal 241 configured to hold a substrate 202 thereon. The pedestal 241 may include one or more radiofrequency (RF) meshes embedded within the pedestal 241. For example, as illustrated in FIG. 2A the pedestal 241 may include one or more internal meshes, such as a first internal mesh 206 and a second internal mesh 208. FIG. 2B illustrates an example configuration of the various meshes that may be included in the pedestal 241, according to some embodiments. The view of the pedestal 241 in FIG. 2B may represent a top view of the pedestal 241 in FIG. 2A, and may provides an internal view of the mesh locations within the pedestal 241. For example, the first internal mesh 206 may include a semicircle, hemispherical, or half-circle RF mesh. Similarly, the second internal mesh 208 may include a semicircle, hemispherical, or half-circle RF mesh. The first internal mesh 206 and the second internal mesh may be formed by a pattern of conductive wiring, such as a grid of copper wiring. A gap or insulating space may be present between the first internal mesh 206 and the second internal mesh 208. Although not illustrated explicitly in FIG. 2B, the one or more internal meshes may include a single mesh that combines both the first internal mesh 206 and the second internal mesh 208 into a single, circular internal mesh. Alternatively, the one or more internal meshes may include more than two internal meshes. For example, the one or more internal meshes may include four circular quadrants of meshes, six meshes, and so forth. More generally, the pattern of the one or more internal meshes may include sectors of the circular pattern illustrated in FIG. 2A, as well as concentric rings or circles.

The first internal mesh 206 and the second internal mesh 208 may be coupled to power sources to provide RF power to the plasma in the processing region 220 and/or to provide an electrostatic chucking (ESC) force to hold the substrate 202 against the pedestal 241 during the deposition process. For example, the first internal mesh 206 may be coupled to a first lead 212 that extends out of the pedestal 241. The first lead 212 may be coupled to a first ESC source 230. The first ESC source 230 may include a DC voltage source that provides a DC voltage to a portion of the substrate 202 that is directly above the first internal mesh 206. An RF filter circuit may be placed between the first ESC source 230 and the first internal mesh 206. The RF filter circuit may include active or passive components, such as an inductor 232, resistors, and/or a variable capacitor 234. The RF filter circuit may be configured with components that filter out the RF frequencies that may be provided to or coupled to the first lead 212, for example, to protect the first ESC source 230.

Similarly, the second internal mesh 208 may be coupled to a second ESC source 240 that provides a opposing DC voltage relative to the first ESC source 230. For example, the second internal mesh 208 may be coupled to a second lead 210 that extends out of the pedestal 241. The potential difference between the first ESC source 230 and the second ESC source 240 may generate an electrostatic force that holds the substrate 202 to the pedestal 241. An RF filter circuit comprising an inductor 242, resistors, and/or a variable capacitor 244 may be placed between the second lead 210 and the second ESC source 240 to filter out RF frequencies that may be present on the second lead 210.

The first lead 212 and/or the second lead 210 may also be coupled to an RF source that is configured to deliver RF power to the one or more internal meshes in the pedestal 241. For example, a single RF source 250 may provide RF power to the first lead 212 and/or the second lead 210. In some embodiments, one or more variable capacitors 258 may be coupled between the RF source 250 and the one or more internal meshes. As described below, adjusting the individual capacitances of the one or more variable capacitors 258 may adjust the amount of RF power that is provided to each of the one or more internal meshes in the pedestal 241.

When producing a film through the deposition process on the substrate 202, a number of technical issues may arise that affect the quality of the film. For example, the film on the substrate 202 may be formed by the radicals and/or the ions resulting from the plasma. When the film is formed primarily from the high-energy ions, the film is stronger, denser, and less likely to crack or peel. In comparison, a film that is formed primarily by the radicals from the plasma tends to be less dense and more likely to crack and peel. Therefore, some embodiments form an electric field between the plasma in the processing region 220 and the pedestal 241 in order to accelerate the high-energy ions in the plasma towards the substrate 202 when forming the film. For example, the potential difference between the RF power provided to the first internal mesh 206 and/or the second internal mesh 208 and the potential of the plasma in the processing region 220 may cause an electric field to form that accelerates the ions in the plasma towards the substrate 202.

However, since the one or more internal meshes are generally disposed beneath the substrate 202, the directionality of the electric field may be primarily oriented in a vertical direction. In other words, the electric field generated by the potential difference between the plasma and the pedestal 241 causes the ions to be directed downward perpendicularly onto the surface of the substrate 202. While this creates a dense and durable film on the surface of the substrate, this vertical electric field also tends to generate a problematic film on the edge or bevel of the substrate. For example, some substrate designs may include a bevel edge that creates a small gap or angled surface along the edge of the substrate 202. Therefore, the bevel edge of the substrate 202 may include surfaces that are not perpendicular to the vertical electric field. The bevel edge of the substrate 202 may also create a small gap that makes it difficult for the ions to access areas that are within the gap. The radicals of the plasma are able to enter the small gap and therefore primarily form the material film on the edge or bevel of the substrate 202. In consequence, the film quality at the edge of the substrate 202 is less dense and thus prone to cracking or peeling. For example, traditional approaches to forming a film may include cracks or defects on greater than 60% of the area of the edge of the substrate 202. Other test data has revealed greater than 70% and/or greater than 80% of the edge area including cracks or defects, depending on the RF power and configuration of the pedestal 241.

The embodiments described herein solve this technical problem. In some embodiments, the system may provide RF power to the one or more internal meshes embedded in the pedestal in such a way that the RF power generates a horizontal component in the electric field. This horizontal component may in turn direct the ions from the plasma in a diagonal direction that increases the likelihood of the film at the periphery and bevel edge of the substrate 202 to be formed by the ions rather than the radicals of the plasma.

One technique for generating a horizontal component in the electric field is to control the relative RF power provided to the one or more internal meshes. For example, the embodiment illustrated in FIG. 2A shows the first internal mesh 206 and the second internal mesh 208 described above. Additionally, some designs of the pedestal 241 may include an external mesh 204 that surrounds the one or more internal meshes. The external mesh 204 may have a ring-shape that encircles the one or more internal meshes as illustrated in FIG. 2B. A gap or insulated area may separate the external mesh 204 from the one or more internal meshes, such that the external mesh 204 is electrically isolated from the one or more internal meshes. The external mesh 204 may be implemented using a grid or other pattern of conductive wiring to form the ring-shape of the external mesh 204. Like the first internal mesh 206 and the second internal mesh 208, the external mesh 204 may be coupled with a third lead 214. The third lead 214 may exit the pedestal 241 and be coupled to the RF source 250. Additionally, the variable capacitors 258 may include an variable capacitor 254 that is placed between the RF source 250 and the external mesh 204.

The directionality of the electric field at the periphery of the substrate 202 may be controlled by adjusting the capacitance values of the variable capacitors 258. For example, since each of the meshes are coupled to the same RF source 250, providing the same capacitance value for each of the variable capacitors 258 may provide the same RF power to each of the meshes. Thus, the external mesh 204, the first internal mesh 206, and the second internal mesh 208 may appear to the plasma to be a single mesh providing a uniform RF power throughout. This may generate a predominantly uniform electric field directed vertically down from the plasma to the substrate 202. Since the area of the meshes and the plasma both extend out beyond the diameter of the substrate 202, the electric field will be generally vertical over the substrate 202 and direct the ions straight down onto the surface of the substrate 202. This may result in the edge cracking or peeling at the bevel edge of the substrate 202.

In order to generate a horizontal component to the electric field at the edge of the substrate 202, the RF power provided to the external mesh may be reduced. For example, by reducing the value of the variable capacitor 254 within a range of about 51 nF down to about 0 nF, the RF power provided to the external mesh 204 may be reduced relative to the RF power provided to the first internal mesh 206 and the second internal mesh 208. Since the plasma extends beyond the edge of the diameter of the substrate 202, the potential difference between the outer plasma and the one or more internal meshes may now be directed inwards towards the edge of the substrate 202. Alternatively, increasing the variable capacitance of the variable capacitors 252, 256 may decrease the impedance on the first lead 212 and/or the second lead 210 and thereby increase the RF power provided to the first internal mesh 206 and/or the second internal mesh 208 relative to the external mesh 204. This may also cause the electric field to be directed from the outer portion of the plasma to the one or more internal meshes, thereby generating a horizontal component in the electric field that is directed inwards towards the periphery of the substrate 202.

Figure 3:
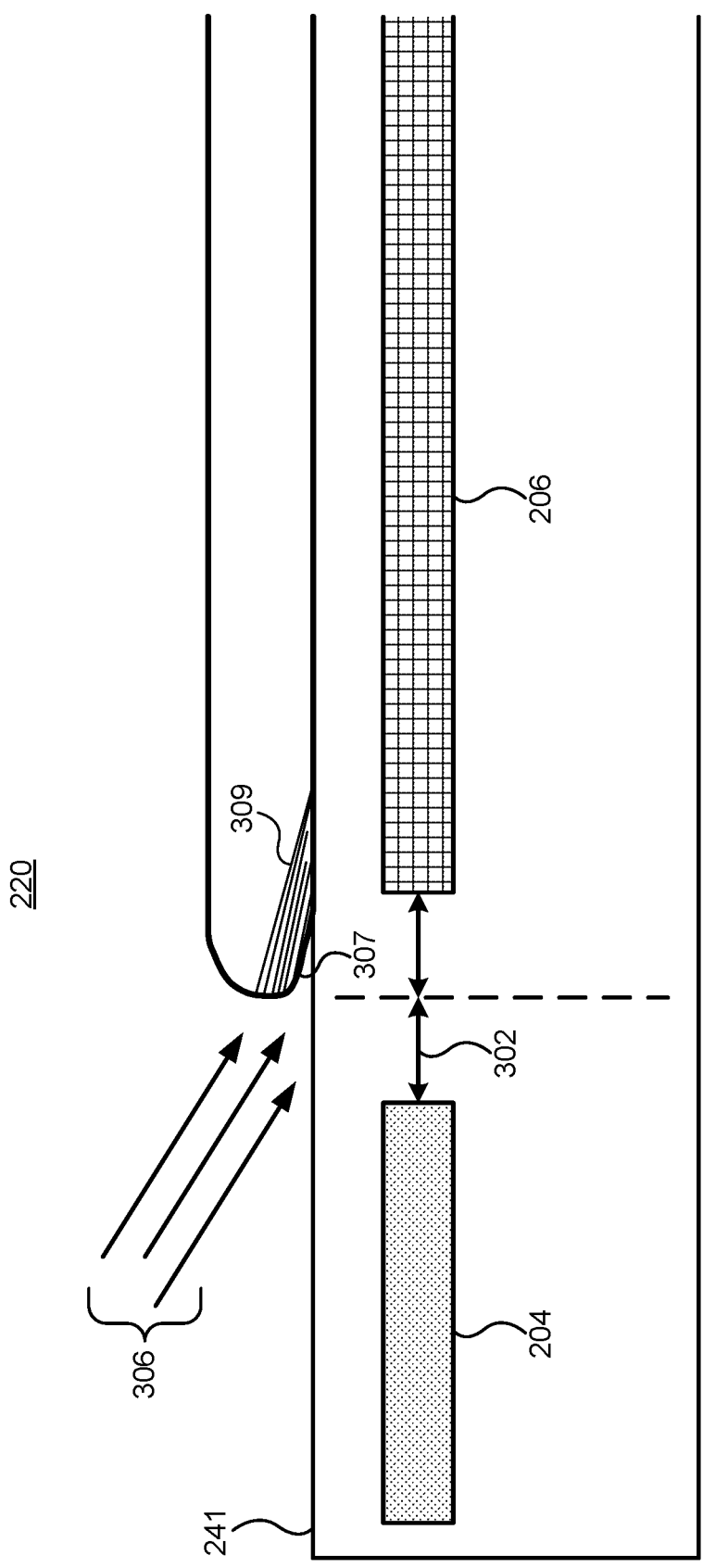
FIG. 3 illustrates a diagram of the pedestal and the placement of the meshes relative to the substrate, according to some embodiments.

FIG. 3 illustrates a diagram of the pedestal 241 and the placement of the meshes relative to the substrate 202, according to some embodiments. As described above, when the RF power provided to the external mesh 204 is less than the RF power provided to the first internal mesh 206, the electric field 306 may include a horizontal component that causes the electric field 306 to be directed at least partially towards the edge of the substrate 202. The substrate 202 may include a bevel edge 307 as illustrated in FIG. 3. By way of example, FIG. 3 also illustrates how a film 309 at the bevel edge 307 may crack or peel for the reasons described above. Note that the bevel edge 307 is provided only by way of example and is not meant to be limiting. Other edge geometries may be present in different embodiments.

In addition to adjusting the relative RF power provided to the meshes, some embodiments may also change the physical configuration of the meshes in order to reduce the amount of film cracking along the edge of the substrate 202. For example, the one or more internal meshes may have a diameter that is less than a diameter of the substrate 202. The smaller diameter may cause the substrate 202 to completely cover the one or more internal meshes in the pedestal 241. As illustrated in the example of FIG. 3, the edge of the substrate 202 may extend out beyond the diameter or edge of, for example, the first internal mesh 206. By reducing the RF power delivered to the external mesh 204, and/or by moving the edge of the one or more internal meshes inwards further underneath the substrate 202, the horizontal component of the electric field 306 may be increased. This in turn increases the number of ions that may hit the edge or bevel of the substrate 202. As described above, this will increase the quality of the film at the edge of the substrate 202.

Reducing the diameter of the one or more internal meshes may also solve another technical problem present in the deposition process. Specifically, arcing is a condition where the DC buildup of charge in the electrostatic chuck discharges into another portion of the processing region 220. For example, an electrical arc may be generated between any of the meshes described herein and the substrate, the sidewalls of the processing chamber, the plasma, and/or any other conductive element in the semiconductor processing chamber 200. These arcs may cause damage to the substrate 202 and/or the semiconductor processing chamber. These arcs may also affect the quality of the film being deposited on the substrate 202. The embodiments described herein solve the technical problem of arcing by reducing the diameter of the internal meshes to be less than the diameter of the substrate 202. It has been discovered that reducing the size of the internal meshes such that they are covered by the area of the substrate 202 may completely eliminate arcing during the deposition process.

The distance 304 between the outer edge of the substrate 202 and the outer diameter of the one or more internal meshes may vary in different embodiments. For example, some embodiments may provide internal meshes having a diameter that is approximately equal to the diameter of the substrate 202. This configuration may be sufficient to eliminate arcing in some implementations. Other embodiments may further reduce the outer diameter of the internal meshes such that the distance 304 is greater than 0 mm. Generally, increasing the distance 304 between the diameter of the substrate 202 and the outer diameter of the internal meshes will decrease arcing. However, increasing the distance 304 too much may reduce the strength of the electric field at the periphery of the substrate 202 and began to negatively affect the quality of the film being formed. Conversely, decreasing the size of the DC mesh can lead to inadequate chucking, especially for processes where wafer bow becomes more tensile as the process continues.

Some embodiments may size the outer diameter of the internal meshes such that the distance 304 is about 1 mm, about 2 mm, about 3 mm, about 4 mm, about 5 mm, about 6 mm, about 7 mm, about 8 mm, about 9 mm, about 10 mm, about 12 mm, about 15 mm, or greater, depending on characteristics of the chamber. In some embodiments, the distance 304 may range from between about 0 mm and about 2 mm, between about 2 mm and about 5 mm, between about 5 mm and about 7 mm, between about 7 mm and about 10 mm, between about 10 mm and about 12 mm, between about 12 mm and about 15 mm, or greater and/or any combination of these ranges depending on the characteristics of the chamber. Other embodiments may size the internal meshes based on a diameter of the substrate 202. For example, some embodiments may size the outer diameter of the internal meshes to be between about 100% and about 98% of the diameter of the substrate 202. In other examples, the outer diameter of the internal meshes may be less than or between about 98% and about 96%, less than or between about 96% and about 95%, less than or between about 95% and about 94%, less than or between about 94% and about 93%, less than or between about 93% and about 92%, less than or between about 92% and about 90%, and less than about 90% and/or any combination of these ranges depending on the characteristics of the chamber.

Note that reducing the outer diameter of the internal meshes to be less than the diameter of the substrate 202 is not always necessary, but may result in improved performance. For example, some embodiments may use a first internal mesh 206 and a second internal mesh 208 with an outer diameter larger than or equal to the diameter of the substrate 202. However, by reducing the relative RF power provided to the external mesh 204, the film quality at the edge of the substrate 202 may be improved. Other embodiments may combine the reduced size of the internal meshes with the RF tuning using the variable capacitors 258 to improve performance.

Some embodiments may size the inner diameter of the external mesh 204 such that the distance 302 is about 1 mm, about 2 mm, about 3 mm, about 4 mm, about 5 mm, about 6 mm, about 7 mm, about 8 mm, about 9 mm, about 10 mm, about 12 mm, about 15 mm, or greater, depending on characteristics of the chamber. In some embodiments, the distance 302 may range from between about 0 mm and about 2 mm, between about 2 mm and about 5 mm, between about 5 mm and about 7 mm, between about 7 mm and about 10 mm, between about 10 mm and about 12 mm, between about 12 mm and about 15 mm, or greater and/or any combination of these ranges depending on the characteristics of the chamber. Other embodiments may size the external mesh 204 based on a diameter of the substrate 202. For example, some embodiments may size the inner diameter of the external mesh 204 to be between about 100% and about 102% of the diameter of the substrate 202. In other examples, the inner diameter of the external mesh 204 may be greater than or between about 102% and about 104%, greater than or between about 104% and about 105%, greater than or between about 105% and about 106%, greater than or between about 106% and about 107%, greater than or between about 107% and about 108%, greater than or between about 108% and about 110%, and greater than about 110% and/or any combination of these ranges depending on the characteristics of the chamber.

In some embodiments, the external mesh 204 may be eliminated entirely. While the embodiments discussed above may include the external mesh 204 to provide flexibility in how RF power is provided to the pedestal 241, it is possible to eliminate the external mesh 204 from the pedestal 241. Alternatively, the power may be reduced or eliminated through the variable capacitor 254, to greatly reduce the effect of the external mesh 204. For example, some portions of the deposition process may benefit from power being provided to the external mesh 204, while other portions of the deposition process may benefit from power being reduced to the external mesh 204. Therefore, some embodiments may dynamically adjust the RF power provided to the external mesh relative to the one or more internal meshes by adjusting the variable capacitors 258 during the deposition process.

For example, the system may include a controller 260 that is programmed to dynamically adjust the capacitance values of the variable capacitors 258 at runtime during the deposition process. For example, the semiconductor processing chamber 200 may operate using a "recipe" that includes recipe steps that adjust the operating conditions or actions taken by the semiconductor processing chamber 200. The recipe may adjust temperatures, pressures, gas flow rates, gas species present in the processing region 220, RF power provided to the meshes, DC power provided to the meshes, and so forth. In some embodiments, the recipe may include adjustments to the variable capacitors 258 during the deposition process. For example, RF power may be provided to the external mesh 204 during a first portion of the deposition process, and the RF power may be removed from the external mesh 204 during a second portion of the deposition process by adjusting the capacitance of the variable capacitor 254 in the recipe.

The controller 260 may include one or more processors (e.g., microprocessors, microcontrollers, processor cores, distributed processors, and so forth). The processor(s) may be programmed to perform operations based on instructions stored on one or more memory devices (e.g., cache memory, disk memory, temporary memory, RAM or ROM devices, and so forth). In some embodiments, the instructions may be stored on a non-transitory, tangible, computer-readable medium, such as a physical storage device. The instructions may optionally be stored on a computer program product that is separate and distinct from the processors.

The one or more processors may be implemented in a local controller on the semiconductor processing chamber 200. The one or more processors may also be distributed on a number of different computing systems. For example, the controller 260 may be part of a local or remote server that controls the operations of the semiconductor processing chamber 200. The instructions may be distributed between a server and a local controller during the deposition process.

The sizing of the internal meshes relative to the substrate 202 and the recipe settings for the variable capacitors 258 may be set during the design and/or configuration of the semiconductor processing chamber 200. Specifically, the design of these components may be tested and adjusted during manufacturing of the semiconductor processing chamber 200. For example, a substrate may undergo a deposition process in the processing region 220. The quality of the film at the bevel of the substrate 202 may then be analyzed using a bevel inspection tool, a metrology station, or any other technique for measuring or viewing the quality of the film. The recipe may then be updated to adjust the values for the variable capacitors 258 to improve the film quality.

For example, some embodiments may set a threshold value for an acceptable amount of cracking of the film at the bevel of the substrate 202. This threshold may be less than 25%, less than 20%, less than 15%, less than 10%, less than 5%, less than 2%, and/or less than any other value depending on the requirements of the substrate. The quality of the film may be measured and assigned a value based on the amount of cracking observed on the substrate. The recipe may then be altered to, for example, reduce the capacitance of the external mesh 204 during at least a portion of the process. A subsequent substrate may then be processed using the updated recipe, and the resulting film may be measured to determine whether the cracking has been reduced to below the acceptable threshold. This process may be repeated until the optimal capacitance values are determined. This iterative process may generate an optimal set of capacitor values that does not reduce the electric field at the periphery of the substrate too much, but generates enough of a horizontal component to create a quality film at the bevel. For example, the capacitance of the variable capacitor 254 on the external mesh 204 may be increased until less than 10% of the film on the periphery of the substrate is cracked, until less than 5% of the film on the periphery of the substrate is cracked, and so forth.

This process may also be used to determine an optimal size for the one or more internal meshes. For example, the size and outer diameter of the internal meshes may be reduced until cracking has been reduced below the acceptable threshold. Additionally, the size of the internal meshes may be reduced until arcing is eliminated during the deposition process. These design-time improvements to the size of the internal meshes and/or the variable capacitor values may be carried out individually or in combination to effectively solve both the arcing and film quality problems.

In addition to the design-time adjustments described above, some embodiments may also make dynamic adjustments based on in situ measurements taken during the deposition process. For example, different characteristics of the deposition process may be measured using techniques such as optical spectroscopy, gas sampling, and so forth. Some embodiments may also monitor voltage or RF power characteristics provided to the one or more internal meshes or the external mesh 204, such as an impedance, reflected power, a current, and/or any other characteristic. These measured characteristics may be correlated with a film quality at the bevel or periphery of the substrate 202. The controller 260 may process these measured characteristics in real time and make adjustments to the variable capacitors 258 to improve the quality of the film. For example, a measured characteristic may be correlated with a cracking above acceptable threshold (e.g. above 5%). The controller 260 may adjust the variable capacitors 258 until the measured characteristics is correlated with a cracking below the acceptable threshold.

FIG. 4 illustrates a flowchart of a method 400 of reducing cracks in films on peripheries of substrates during deposition processes, according to some embodiments. This method may be performed by the semiconductor processing chamber described above.

Additionally, some of the operations in this method may be executed by the controller 260. These processor operations may be embodied and stored instructions that are executed by the processor to cause the specified conditions to occur in the processing region 220.

The method may include supporting a substrate on a pedestal in a semiconductor processing chamber (402). The semiconductor processing chamber may be configured to perform a plasma-enhanced chemical-vapor deposition (PECVD) process that forms a film on a surface of the substrate. For example, the deposition process may include forming alternating oxide and nitride layers in an ONO stack. The deposition process may also include forming a relatively thick layer of silicon oxide (e.g., using a TEOS precursor) that is greater than 10 μm, greater than 15 μm, greater than 20 μm, greater than 25 μm, greater than 30 μm, or larger. The substrate may be formed from silicon, silicon germanium, or other substrate materials. The layers may include IPD layers of ONO layers, including a dielectric material, which may be silicon oxide, in alternating layers with a placeholder material, which may be silicon nitride or polysilicon, for example. In some embodiments, the number of film layers may be very large and may include 10 or more layer pairs, 20 more layer pairs, 50 or more layer pairs, 100 or more layer pairs, and so forth. For example, a height of the semiconductor structure may be more than 10 μm, more than 20 μm, and so forth.

The method may also include providing a precursor to a semiconductor processing chamber, wherein the precursor comprises a material for the film to be formed on the substrate (404). The precursor may include carrier gases, such as nitrogen, helium, argon, or other noble, inert, or useful precursors. The precursors may also include gas species that include a material for the film, such as TEOS, $O_2$, $N_2O$, $SiH_4$, $NH_3$, $N_2$, and so forth. Flow rates for the precursor gas during this step may range from between about 0 sccm to about 13000 sccm. For example, the flow rates may range from between 0 sccm to about 1000 sccm, between 1000 sccm to about 2000 sccm, between 2000 sccm to about 3000 sccm, between 3000 sccm to about 4000 sccm, between 4000 sccm to about 5000 sccm, between 5000 sccm to about 6000 sccm, between 6000 sccm to about 7000 sccm, between 7000 sccm to about 8000 sccm, between 8000 sccm to about 9000 sccm, between 9000 sccm to about 10,000 sccm, between 10,000 sccm to about 11,000 sccm, between 11,000 sccm to about 12,000 sccm, between 12,000 sccm to about 13,000 sccm, greater than 13.00 sccm, and/or any combination of ranges therein.

The method may additionally include forming a plasma from the precursor in the semiconductor processing chamber (406). The temperature within the processing chamber or at the substrate level may be maintained between about 200° C. and about 700° C. in embodiments. The temperature may be maintained above or about 200° C., and may be maintained above or about 250° C., above or about 300° C., above or about 350° C., above or about 400° C., above or about 450° C., above or about 500° C., above or about 550° C., above or about 600° C., above or about 650° C., above or about 700° C., or higher. The pressure may be maintained below or about 15 Torr, and may be maintained below or about 10 Torr, below or about 5 Torr, below or about 4 Torr, below or about 3 Torr, below or about 2 Torr, below or about 1 Torr, below or about 100 mTorr, or lower. In embodiments the pressure may be maintained between about 500 mTorr and about 10 Torr.

The method may further include delivering RF power to plasma through one or more internal meshes embedded in the pedestal (408). The plasma power applied may range from between about 0 W to about 5000 W. For example, the plasma power may range from between about 0 W to about 1000 W, between about 1000 W to about 2000 W, between about 2000 W to about 3000 W, between about 3000 W to about 4000 W, between about 4000 W to about 5000 W, and/or any combination of ranges therein. In some embodiments, a range of frequencies may be associated with the applied RF power. For example, some embodiments may use a high-frequency RF source of approximately 27 MHz. Some embodiments may additionally or alternatively use a low-frequency RF source of approximately 350 kHz. A range of frequencies may also be applied between these two frequencies, such as 13.56 MHz, and other common frequencies or frequency ranges. Some embodiments may also use higher frequency ranges, such as 40 MHz. In note that these embodiments are compatible with any frequency range or sub range between 300 kHz and 40 MHz, or higher.

The method may also include causing an electric field comprising a horizontal component that directs ions from the plasma to a periphery of the substrate when forming the film (410). This horizontal component may be caused by adjusting the RF power delivered to the various meshes in the pedestal. For example, as illustrated above in FIG. 2A, the RF power may be tuned using variable capacitors between a single RF source and each of the various meshes in the pedestal. As described above, adjusting the RF power via the tunable capacitors or other means may direct more RF power to internal meshes than external meshes. This in turn may direct the electric field inwards and add a horizontal component to the electric field. This may direct a component of the electric field towards the bevel or outer edge of the substrate.

The horizontal component may also be caused by reducing the size of the one or more internal meshes relative to the size of the substrate. For example, as illustrated above in FIG. 3, the outer diameter of the one or more internal meshes may be reduced to be less than or equal to a diameter of the substrate. In various embodiments the diameter of the substrate may be between 0 mm and 5 mm greater than the outer diameter of the meshes, the outer diameter of the meshes may be between 95% to 99% of the diameter of the substrate, and/or any other of the comparative sizes described above. The outer diameter of the internal meshes may be reduced until arcing is effectively eliminated or reduced below acceptable threshold (e.g., 5%). Some embodiments may also eliminate the external mesh or reduce an RF power delivered to the RF mesh.

It should be appreciated that the specific steps illustrated in FIG. 4 provide particular methods of forming films on substrates according to various embodiments. Other sequences of steps may also be performed according to alternative embodiments. For example, alternative embodiments may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 5:
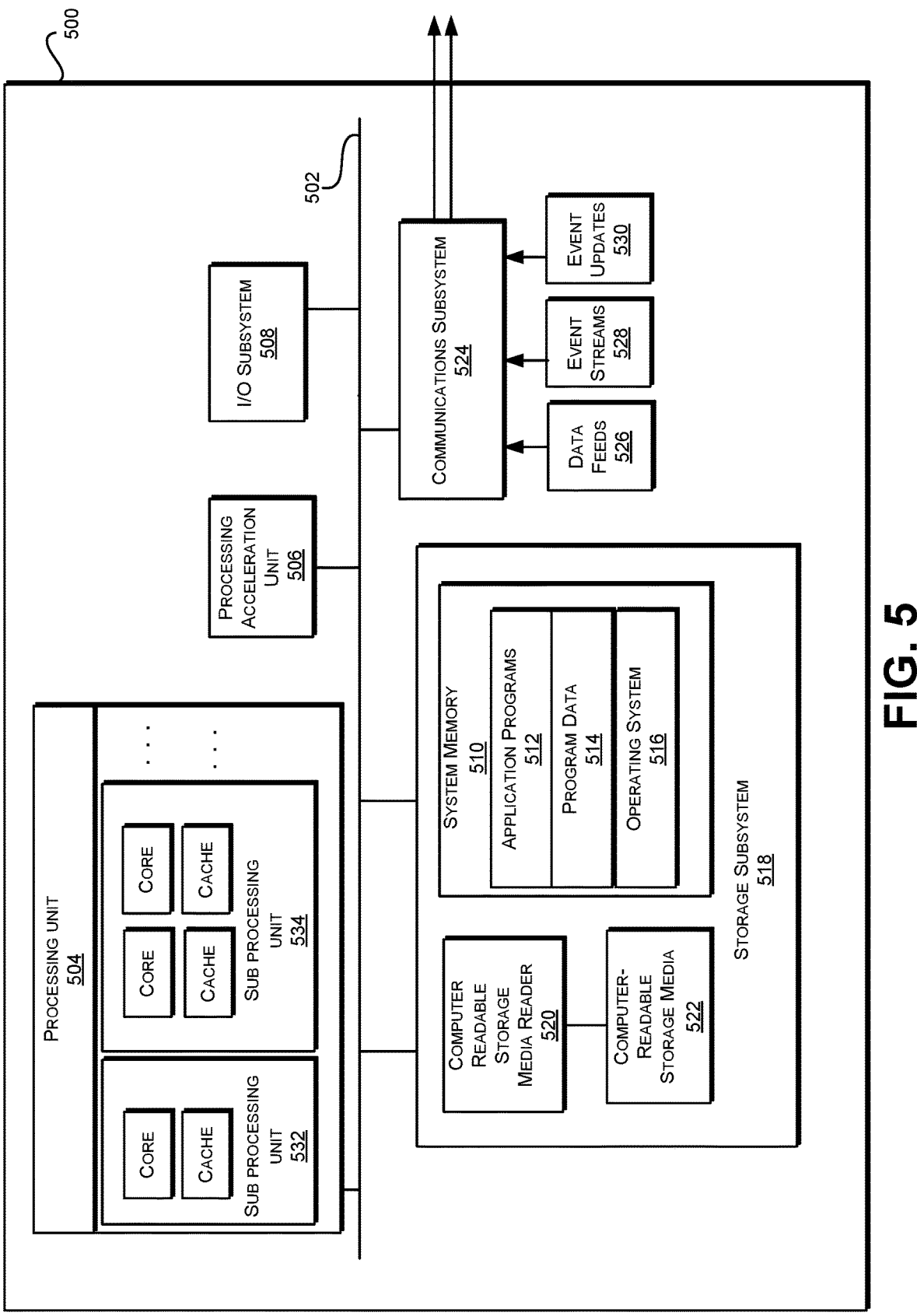
FIG. 5 illustrates an exemplary computer system, in which various embodiments may be implemented.

FIG. 5 illustrates an exemplary computer system 500, in which various embodiments may be implemented. The system 500 may be used to implement any of the computer systems described above. As shown in the figure, computer system 500 includes a processing unit 504 that communicates with a number of peripheral subsystems via a bus subsystem 502. These peripheral subsystems may include a processing acceleration unit 506, an I/O subsystem 508, a storage subsystem 518 and a communications subsystem 524. Storage subsystem 518 includes tangible computer-readable storage media 522 and a system memory 510.

Bus subsystem 502 provides a mechanism for letting the various components and subsystems of computer system 500 communicate with each other as intended. Although bus subsystem 502 is shown schematically as a single bus, alternative embodiments of the bus subsystem may utilize multiple buses. Bus subsystem 502 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 504, which can be implemented as one or more integrated circuits (e.g., a conventional microprocessor or microcontroller), controls the operation of computer system 500. One or more processors may be included in processing unit 504. These processors may include single core or multicore processors. In certain embodiments, processing unit 504 may be implemented as one or more independent processing units 532 and/or 534 with single or multicore processors included in each processing unit. In other embodiments, processing unit 504 may also be implemented as a quad-core processing unit formed by integrating two dual-core processors into a single chip.

In various embodiments, processing unit 504 can execute a variety of programs in response to program code and can maintain multiple concurrently executing programs or processes. At any given time, some or all of the program code to be executed can be resident in processor(s) 504 and/or in storage subsystem 518. Through suitable programming, processor(s) 504 can provide various functionalities described above. Computer system 500 may additionally include a processing acceleration unit 506, which can include a digital signal processor (DSP), a special-purpose processor, and/or the like.

I/O subsystem 508 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 500 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 500 may comprise a storage subsystem 518 that comprises software elements, shown as being currently located within a system memory 510. System memory 510 may store program instructions that are loadable and executable on processing unit 504, as well as data generated during the execution of these programs.

Depending on the configuration and type of computer system 500, system memory 510 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 504. In some implementations, system memory 510 may include multiple different types of memory, such as static random access memory (SRAM) or dynamic random access memory (DRAM). In some implementations, a basic input/output system (BIOS), containing the basic routines that help to transfer information between elements within computer system 500, such as during start-up, may typically be stored in the ROM. By way of example, and not limitation, system memory 510 also illustrates application programs 512, which may include client applications, Web browsers, mid-tier applications, relational database management systems (RDBMS), etc., program data 514, and an operating system 516. By way of example, operating system 516 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 518 may also provide a tangible computer-readable storage medium for storing the basic programming and data constructs that provide the functionality of some embodiments. Software (programs, code modules, instructions) that when executed by a processor provide the functionality described above may be stored in storage subsystem 518. These software modules or instructions may be executed by processing unit 504. Storage subsystem 518 may also provide a repository for storing data used in accordance with some embodiments.

Storage subsystem 500 may also include a computer-readable storage media reader 520 that can further be connected to computer-readable storage media 522. Together and, optionally, in combination with system memory 510, computer-readable storage media 522 may comprehensively represent remote, local, fixed, and/or removable storage devices plus storage media for temporarily and/or more permanently containing, storing, transmitting, and retrieving computer-readable information.

Computer-readable storage media 522 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 500.

By way of example, computer-readable storage media 522 may include a hard disk drive that reads from or writes to non-removable, nonvolatile magnetic media, a magnetic disk drive that reads from or writes to a removable, nonvolatile magnetic disk, and an optical disk drive that reads from or writes to a removable, nonvolatile optical disk such as a CD ROM, DVD, and Blu-Ray® disk, or other optical media. Computer-readable storage media 522 may include, but is not limited to, Zip® drives, flash memory cards, universal serial bus (USB) flash drives, secure digital (SD) cards, DVD disks, digital video tape, and the like. Computer-readable storage media 522 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 500.

Communications subsystem 524 provides an interface to other computer systems and networks. Communications subsystem 524 serves as an interface for receiving data from and transmitting data to other systems from computer system 500. For example, communications subsystem 524 may enable computer system 500 to connect to one or more devices via the Internet. In some embodiments communications subsystem 524 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 524 can provide wired network connectivity (e.g., Ethernet) in addition to or instead of a wireless interface.

In some embodiments, communications subsystem 524 may also receive input communication in the form of structured and/or unstructured data feeds 526, event streams 528, event updates 530, and the like on behalf of one or more users who may use computer system 500.

By way of example, communications subsystem 524 may be configured to receive data feeds 526 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 524 may also be configured to receive data in the form of continuous data streams, which may include event streams 528 of real-time events and/or event updates 530, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 524 may also be configured to output the structured and/or unstructured data feeds 526, event streams 528, event updates 530, and the like to one or more databases that may be in communication with one or more streaming data source computers coupled to computer system 500.

Computer system 500 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 500 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

As used herein, the terms "about" or "approximately" or "substantially" may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMS, EEPROMs, magnetic or optical cards, flash memory, or other types of machine-readable mediums suitable for storing electronic instructions. Alternatively, the methods may be performed by a combination of hardware and software.

What is claimed is:

1. A semiconductor processing chamber comprising:
a pedestal configured to support a substrate during a plasma-enhanced chemical-vapor deposition (PECVD) process that forms a film on a surface of the substrate;
one or more internal meshes embedded in the pedestal, wherein the one or more internal meshes are configured to deliver radio-frequency (RF) power to a plasma in the semiconductor processing chamber during the PECVD process;
an RF source configured to deliver the RF power to the one or more internal meshes;
one or more variable capacitors coupled between the RF source and the one or more internal meshes, wherein adjusting a capacitance of the one or more variable capacitors adjusts an amount of the RF power that is provided to the one or more internal meshes; and
a controller configured to adjust the capacitance of the one or more variable capacitors to adjust the amount of the RF power that is provided to the one or more internal meshes and cause a horizontal component of an electric field that directs ions from the plasma to a periphery of the substrate when forming the film.

2. The semiconductor processing chamber of claim 1, wherein the one or more internal meshes comprises a plurality of internal meshes.

3. The semiconductor processing chamber of claim 1, wherein the one or more internal meshes comprises a single internal mesh.

4. The semiconductor processing chamber of claim 1, wherein the one or more internal meshes comprises two hemispherical meshes.

5. The semiconductor processing chamber of claim 1, further comprising:
an external mesh having a ring-shape that encircles the one or more internal meshes; and
a variable capacitor coupled between the RF source and the external mesh, wherein adjusting the capacitance of the variable capacitor adjusts an amount of the RF power that is provided to the external mesh.

6. The semiconductor processing chamber of claim 5, the controller is programmed to adjust the variable capacitor and the one or more variable capacitors during the PECVD process to adjust the amount of RF power delivered to the one or more internal meshes and the amount of RF power delivered to the external mesh.

7. The semiconductor processing chamber of claim 1, further comprising a substrate on the pedestal, wherein a diameter of the one or more internal meshes is less than a diameter of the substrate such that the substrate entirely covers the one or more internal meshes when supported by the pedestal.

8. The semiconductor processing chamber of claim 1, wherein an outer diameter of the one or more internal meshes is less that a diameter of the substrate.

9. The semiconductor processing chamber of claim 1, further comprising:
a substrate on the pedestal in the semiconductor processing chamber, wherein the substrate comprises a film formed on a surface of the substrate in the semiconductor processing chamber.

10. The semiconductor processing chamber of claim 9, wherein the film comprises one or more alternating layers of oxide and nitride.

11. The semiconductor processing chamber of claim 9, wherein the film comprises a layer of oxide comprising a thickness of more than 25 μm.

12. A semiconductor processing chamber comprising:
a pedestal configured to support a substrate during a plasma-enhanced chemical-vapor deposition (PECVD) process that forms a film on a surface of the substrate;
one or more internal meshes embedded in the pedestal, wherein the one or more internal meshes are configured to deliver radio-frequency (RF) power to a plasma in the semiconductor processing chamber during the PECVD process, and an outer diameter of the one or more internal meshes is less that a diameter of the substrate;
an RF source configured to deliver the RF power to the one more internal meshes; and
a controller configured to adjust an amount of the RF power that is provided to the one or more internal meshes and cause a horizontal component of an electric field that directs ions from the plasma to a periphery of the substrate when forming the film.

13. The semiconductor processing chamber of claim 12, wherein the diameter of the substrate is between 0 mm and 5 mm greater than the outer diameter of the one or more internal meshes.

14. The semiconductor processing chamber of claim 12, wherein the outer diameter of the one or more meshes is between 95% and 99% of the diameter of the substrate.

15. The semiconductor processing chamber of claim 12, further comprising a substrate on the pedestal, and an external mesh that is ring-shaped and surrounds the one or more internal meshes, and an inner diameter of the external mesh is greater than the diameter of the substrate.

16. The semiconductor processing chamber of claim 12, further comprising a substrate on the pedestal, wherein a difference between the outer diameter of the one or more internal meshes and the diameter of the substrate is sufficient to eliminate arcing from the one or more internal meshes during the PECVD process.

17. The semiconductor processing chamber of claim 12, further comprising a substrate on the pedestal, wherein the pedestal does not include an external mesh that surrounds the one or more internal meshes such that any meshes that deliver the RF power to the plasma are covered by the substrate on the pedestal.

* * * * *